(12) United States Patent
Matsubara et al.

(10) Patent No.: US 9,337,783 B2
(45) Date of Patent: May 10, 2016

(54) DISTORTION COMPENSATION APPARATUS AND DISTORTION COMPENSATION METHOD

(71) Applicant: FUJITSU LIMITED, Kawasaki-shi, Kanagawa (JP)

(72) Inventors: Satoshi Matsubara, Kawasaki (JP); Mitsuharu Hamano, Sendai (JP); Hideharu Shako, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/552,120

(22) Filed: Nov. 24, 2014

(65) Prior Publication Data
US 2015/0077180 A1    Mar. 19, 2015

Related U.S. Application Data

(63) Continuation of application No. PCT/JP2012/063812, filed on May 29, 2012.

(51) Int. Cl.
*H03F 1/26* (2006.01)
*H03F 1/32* (2006.01)
*H04B 1/04* (2006.01)
*H03F 3/24* (2006.01)
(Continued)

(52) U.S. Cl.
CPC .............. *H03F 1/3247* (2013.01); *H03F 3/189* (2013.01); *H03F 3/21* (2013.01); *H03F 3/245* (2013.01); *H04B 1/0475* (2013.01);
(Continued)

(58) Field of Classification Search
USPC .............................. 330/149; 375/296; 455/296
See application file for complete search history.

(56) References Cited

U.S. PATENT DOCUMENTS

2002/0032712 A1    3/2002    Miyasaka et al.
2003/0058959 A1    3/2003    Rafie et al.
(Continued)

FOREIGN PATENT DOCUMENTS

EP    1 858 158 A1    11/2007
EP    2 369 739 A1    9/2011
(Continued)

OTHER PUBLICATIONS

Extended European Search Report mailed Apr. 29, 2015 for corresponding European Patent Application No. 12878006.1.
(Continued)

*Primary Examiner* — Patricia T Nguyen
(74) *Attorney, Agent, or Firm* — Arent Fox LLP

(57) ABSTRACT

A distortion compensation apparatus includes: a storage unit that stores a distortion compensation coefficient; a distortion-compensation-coefficient selecting unit that takes a logarithm of power of an input signal and exponentiates a value obtained by taking the logarithm, and that selects a distortion compensation coefficient that is stored in the storage unit according to a value obtained by the exponentiating; a distortion-compensation processing unit that acquires the selected distortion compensation coefficient from the storage unit, and that performs distortion compensation processing on the input signal to the distortion-compensation-coefficient selecting unit using the acquired distortion compensation coefficient; an amplifier that amplifies the signal subjected to the distortion compensation processing; and a distortion-compensation-coefficient updating unit that updates the distortion compensation coefficient stored in the storage unit based on the amplified signal and the input signal to the distortion-compensation-coefficient selecting unit.

6 Claims, 17 Drawing Sheets

(51) Int. Cl.
*H03F 3/21* (2006.01)
*H03F 3/189* (2006.01)

(52) U.S. Cl.
CPC .... *H03F 2200/336* (2013.01); *H03F 2200/465* (2013.01); *H03F 2201/3215* (2013.01); *H03F 2201/3227* (2013.01); *H03F 2201/3233* (2013.01); *H04B 2001/0425* (2013.01)

(56) References Cited

U.S. PATENT DOCUMENTS

2005/0135506 A1   6/2005   Ma et al.

2007/0030920 A1   2/2007   Funyu et al.

FOREIGN PATENT DOCUMENTS

| | | |
|---|---|---|
| JP | 11-330972 A | 11/1999 |
| JP | 2002-135349 A | 5/2002 |
| JP | 2002-223171 A | 8/2002 |
| JP | 2005-184847 A | 7/2005 |
| JP | 2007-049251 A | 2/2007 |
| JP | 2007-208684 A | 8/2007 |
| JP | 2007-214947 A | 8/2007 |

OTHER PUBLICATIONS

International Search Report, International Application No. PCT/JP2012/063812, dated Aug. 7, 2012.

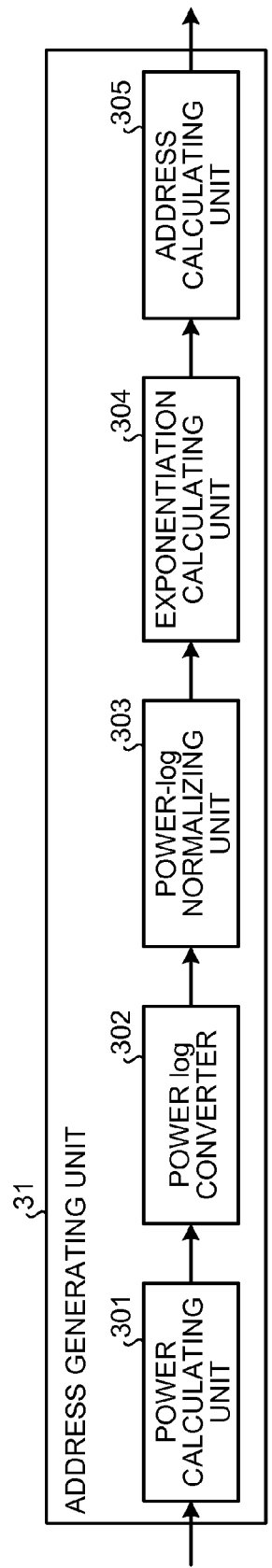

| POWER | NUMBER OF LUT ADDRESSES |
|---|---|
| 10dB TO 0dB | 16 ADDRESSES |
| 0dB TO -10dB | 16 ADDRESSES |
| -10dB TO -20dB | 16 ADDRESSES |
| -20dB TO -30dB | 16 ADDRESSES |
| -30dB TO -40dB | 16 ADDRESSES |

407

| POWER | NUMBER OF LUT ADDRESSES |
|---|---|
| 10dB TO 0dB | 20 ADDRESSES |
| 0dB TO -10dB | 20 ADDRESSES |
| -10dB TO -20dB | 20 ADDRESSES |
| -20dB TO -30dB | 20 ADDRESSES |
| -30dB TO -40dB | 20 ADDRESSES |

FIG.19

| POWER | NUMBER OF LUT ADDRESSES |
|---|---|
| 10dB TO 0dB | 43 ADDRESSES |
| 0dB TO -10dB | 29 ADDRESSES |
| -10dB TO -20dB | 18 ADDRESSES |
| -20dB TO -30dB | 8 ADDRESSES |
| -30dB TO -40dB | 2 ADDRESSES |

DISTORTION COMPENSATION APPARATUS AND DISTORTION COMPENSATION METHOD

CROSS-REFERENCE TO RELATED APPLICATION

This application is a continuation of International Application No. PCT/JP2012/063812, filed on May 29, 2012 and designating the U.S., the entire contents of which are incorporated herein by reference.

FIELD

The present invention relates to a distortion compensation apparatus and a distortion compensation method.

BACKGROUND

In recent years, high-efficiency transmission by digitalization has been widely adopted. When a multi-phase modulation scheme is adopted in wireless communication as a method of achieving high-efficiency transmission, a technique of suppressing nonlinear distortion by linearizing input/output characteristics particularly of a power amplifier on a transmission side, and of reducing leakage power of an adjacent channel is important. Moreover, when an amplifier with poor linearity is used to improve power efficiency, it is desirable that nonlinear distortion be compensated.

In mobile communication such as wideband code division multiple access (W-CDMA), transmission power of a transmission device is 10 milliwatts (mW) to several tens of watts (W), the input/output characteristics of the power amplifier has nonlinearity. In this case, the input/output characteristics of the power amplifier is expressed by a distortion function f(p). This nonlinearity causes nonlinear distortion, and a frequency spectrum around a transmission frequency f(0) leaks to an adjacent channel due to side lobe, to result in causing adjacent interference. That is, because of the nonlinear distortion, the power of transmission wave that leaks to an adjacent frequency channel increases. The amount of this leakage power is indicated by an adjacent channel power ratio (ACPR) that is a ratio between power of a channel of an own device having f(0) in center and adjacent leakage power that leaks to an adjacent channel. That is, it can be understood that when the adjacent leakage power becomes higher than the power of a channel of an own device, the leakage power has increased. This leakage power is a noise to other channels and deteriorates the communication quality of other channels that are influenced by the leakage power.

Leakage power is small in a linear region and large in a nonlinear region in input/output characteristics of a power amplifier, for example. Therefore, to increase output of the power amplifier, widening the linear region in the input/output characteristics of the power amplifier can be considered. However, to widen the linear region, using a high-performance amplifier is considered, and it results in increase in cost and the size of an apparatus.

Therefore, to suppress distortion of a transmission signal that has passed through an amplifier, a distortion compensation apparatus in a digital linear-distortion compensation scheme is arranged in a wireless communication apparatus in some cases. The digital linear compensation scheme is a scheme in which a carrier wave that is obtained by performing quadrature modulation by a modulation signal is used for feedback detection, and amplitudes of the modulation signal (transmission baseband signal) and a feedback signal (feedback baseband signal) are digitized to be compared, and a distortion compensation coefficient is sequentially updated based on a result of comparison. For example, a distortion compensation apparatus in the digital linear-distortion compensation scheme acquires inverse characteristics of amplification characteristics using a distortion compensation coefficient. The distortion compensation apparatus in the digital linear-distortion compensation scheme then adds distortion of the inverse characteristics of amplification characteristics to a transmission signal before being input to an amplifier. By addition of the distortion of the inverse characteristics, distortion of the transmission signal that has passed through the amplifier is suppressed, and the nonlinearity of the amplifier is compensated.

Among distortion compensation apparatuses as described, there is, for example, one that stores distortion compensation coefficients used for distortion compensation in a lookup table (LUT), and reads a compensation coefficient from the LUT by specifying an address corresponding to the power level of a transmission signal. In such a distortion compensation apparatus, for example, LUT addresses to compensate the nonlinearity of the amplifier according to the power has been generated using, for example, power, amplitude, and a value obtained by performing log conversion on power.

Moreover, a technique in which distortion compensation is performed only when an amplitude value of an input modulation signal is within a predetermined range has been known. Furthermore, a technique in which frequency of specification of each address of LUT is monitored and an address proportional to the power level is converted into an actual LUT address such that the specification frequency is equalized has been known. A technique in which the power level of a signal is detected using a multiplier and lookup elements to an encoding signal that is generated from a square signal of a reception signal, and closed loop gain control is performed using a detected power level has been known.

Patent Document 1: Japanese Laid-open Patent Publication No. 2007-208684
Patent Document 2: Japanese Laid-open Patent Publication No. 2007-49251
Patent Document 3: Japanese Laid-open Patent Publication No. 2005-184847

However, because an allocation method of address is simple in a conventional method of generating an LUT using power, amplitude, or a value obtained by log conversion, an optimal LUT address according to a frequency distribution of input signals cannot be generated. Therefore, by the conventional method, it is difficult to reproduce the nonlinearity of an amplifier according to the power, and the distortion compensation performance can be degraded.

Even if the technique in which distortion compensation is performed only when an amplitude value of an input modulation signal is within a predetermined range is applied, it is difficult to reproduce the nonlinearity of an amplifier according to the power, and the distortion compensation performance can be degraded. Furthermore, even by the technique in which an address proportional to the power level is converted into an actual LUT address such that the designation frequency is equalized is applied, if the circuit size is small, it is difficult to reproduce the nonlinearity of an amplifier according to the power, and the distortion compensation performance can be degraded. Moreover, even if the technique in which closed loop gain control is performed using a power level detected using a squared signal of a reception signal is applied for generation of LUT, it is still difficult to reproduce the nonlinearity of an amplitude according to the power.

SUMMARY

According to an aspect of an embodiment of the invention, a distortion compensation apparatus includes: a storage unit that stores a distortion compensation coefficient; a distortion-compensation-coefficient selecting unit that takes a logarithm of power of an input signal and exponentiates a value obtained by taking the logarithm, and that selects a distortion compensation coefficient that is stored in the storage unit according to a value obtained by the exponentiating; a distortion-compensation processing unit that acquires the selected distortion compensation coefficient from the storage unit, and that performs distortion compensation processing on the input signal to the distortion-compensation-coefficient selecting unit using the acquired distortion compensation coefficient; an amplifier that amplifies the signal subjected to the distortion compensation processing; and a distortion-compensation-coefficient updating unit that updates the distortion compensation coefficient stored in the storage unit based on the amplified signal and the input signal to the distortion-compensation-coefficient selecting unit.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 3 is a block diagram indicating details of an address generating unit;

FIG. 4 is a table indicating allocation of addresses in the LUT according to the first embodiment;

FIG. 5 is a chart indicating correspondence between a value that is obtained by taking a logarithm of power, and by performing normalization and exponentiation, and an allocated address;

FIG. 19 is a table indicating allocation of an address in an LUT according to a modification of the first embodiment;

DESCRIPTION OF EMBODIMENTS

Embodiments of a distortion compensation apparatus and a distortion compensation method disclosed in the present application are explained in detail below based on the drawings. The distortion compensation apparatus and the distortion compensation method disclosed in the present application are not limited to the embodiments below.

[a] First Embodiment

Figure 1:
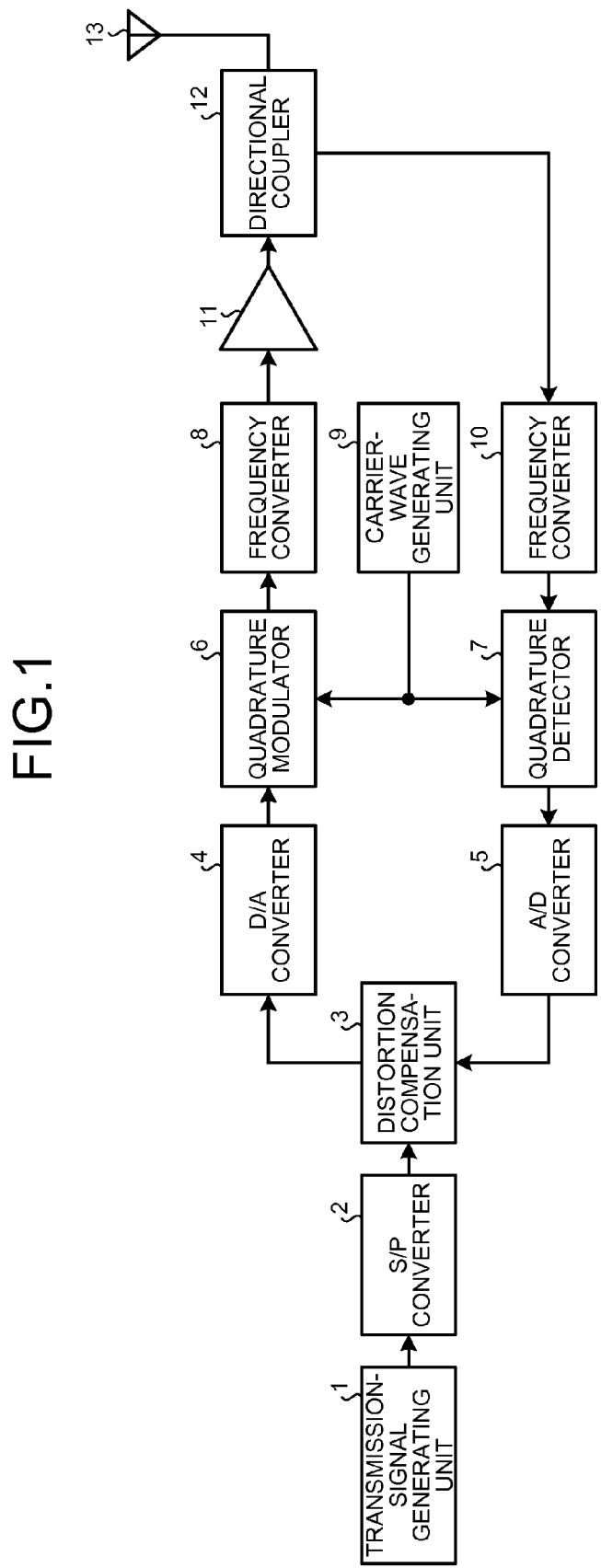
FIG. 1 is a block diagram of a transmission apparatus that includes a distortion compensation apparatus according to a first embodiment.

FIG. 1 is a block diagram of a transmission apparatus that includes a distortion compensation apparatus according to a first embodiment. The transmission apparatus according to the present embodiment includes a transmission-signal generating unit 1, a serial-to-parallel (S/P) converter 2, a distortion compensation unit 3, a digital-to-analog (D/A) converter 4, and an analog-to-digital (A/D) converter 5. Furthermore, the transmission apparatus according to the present embodiment includes a quadrature modulator 6, a quadrature detector 7, a frequency converter 8, a carrier-wave generating unit 9, a frequency converter 10, an amplifier 11, a directional coupler 12, and an antenna 13.

The transmission-signal generating unit 1 generates serial digital data strings. The transmission-signal generating unit 1 inputs a generated data string to the S/P converter 2.

The S/P converter 2 receives input of a serial digital data string from the transmission-signal generating unit 1. The S/P converter 2 converts the received digital data string into two series of an in-phase component signal (I-signal) and a quadrature component signal (Q-signal) by alternately distributing each bit to output to the distortion compensation unit 3.

The distortion compensation unit 3 receives input of the transmission signal that is divided into I-signal and Q-signal from the S/P converter 2. Furthermore, the distortion compensation unit 3 receives a feedback demodulation signal (feedback signal) from the A/D converter 5 described later. The distortion compensation unit 3 then calculates a distortion compensation coefficient from difference between the transmission signal and the feedback demodulation signal. The distortion compensation unit 3 stores the calculated distortion compensation coefficient in an address corresponding to each discrete power of the transmission signal, to update an LUT.

Moreover, the distortion compensation unit 3 generates an address in the LUT corresponding to the power of the received transmission signal. The distortion compensation unit 3 acquires a distortion compensation coefficient stored in the generated address. This acquired compensation coefficient is the distortion compensation coefficient according to the power level of the transmission signal. The distortion compensation unit 3 performs distortion compensation processing using the acquired distortion compensation coefficient. Thereafter, the distortion compensation unit 3 outputs the transmission signal subjected to the distortion compensation processing to the D/A converter 4. Address generation and distortion compensation performed by this distortion compensation unit 3 are explained in detail later.

The D/A converter 4 receives input of a transmission signal including I-signal and Q-signal from the distortion compensation unit 3. The D/A converter 4 converts each of received I-signal and Q-signal into analog baseband signals. Thereafter, the D/A converter 4 outputs the baseband signals to the quadrature modulator 6.

The carrier-wave generating unit 9 generates a reference carrier wave. The carrier-wave generating unit 9 then outputs the generated carrier wave to the quadrature modulator 6 and the quadrature detector 7.

The quadrature modulator 6 receives input of the baseband signals from the D/A converter 4. Furthermore, the quadrature modulator 6 receives input of the reference carrier wave from the carrier-wave generating unit 9. The carrier-wave generating unit 9 then multiplies I-signal out of the received baseband signals by the reference carrier wave. Moreover, the quadrature modulator 6 multiplies Q-signal out of the received baseband signals by a carrier wave that is obtained by phase-shifting the reference carrier wave by 90 degrees. The quadrature modulator 6 then performs quadrature modulation by adding respective multiplication results. Thereafter, the quadrature modulator 6 outputs quadrature modulation signals that are the baseband signals subjected to the quadrature modulation to the frequency converter 8.

The frequency converter 8 receives input of the quadrature modulation signals from the quadrature modulator 6. The frequency converter 8 then mixes the received quadrature modulation signal and a local oscillation signal to convert into a wireless frequency. The frequency converter 8 then outputs a signal including the wireless frequency to the amplifier 11.

The amplifier 11 receives input of the signal including the wireless frequency from the frequency converter 8. The amplifier 11 then amplifies the power of the received signal. Thereafter, the amplifier 11 outputs the amplified signal to the directional coupler 12.

The directional coupler 12 transmits a part of the signal received from the amplifier 11 through the antenna 13. Moreover, the directional coupler 12 outputs a part of the signal received from the amplifier 11 to the frequency converter 10.

The frequency converter 10 receives input of a signal identical to the signal transmitted through the antenna 13 from the directional coupler 12. The frequency converter 10 then performs frequency conversion on the signal received using the local oscillation signal. The frequency converter 10 outputs a quadrature modulation signal subjected to frequency conversion to the quadrature detector 7.

The quadrature detector 7 receives input of the quadrature modulation signal that is subjected to frequency conversion by the frequency converter 10. The quadrature detector 7 then performs quadrature detection by multiplying the received quadrature modulation signal by each of reference carrier waves that are different in phase by 90 degrees. The quadrature detector 7 outputs I-signal and Q-signal that are obtained by quadrature detection to the A/D converter 5.

The A/D converter 5 receives input of I-signal and Q-signal from the quadrature detector 7. The A/D converter 5 then converts the received I-signal and Q-signal into digital signals. Thereafter, the A/D converter 5 outputs I-signal and Q-signal converted into digital signals to the distortion compensation unit 3.

Figure 2:
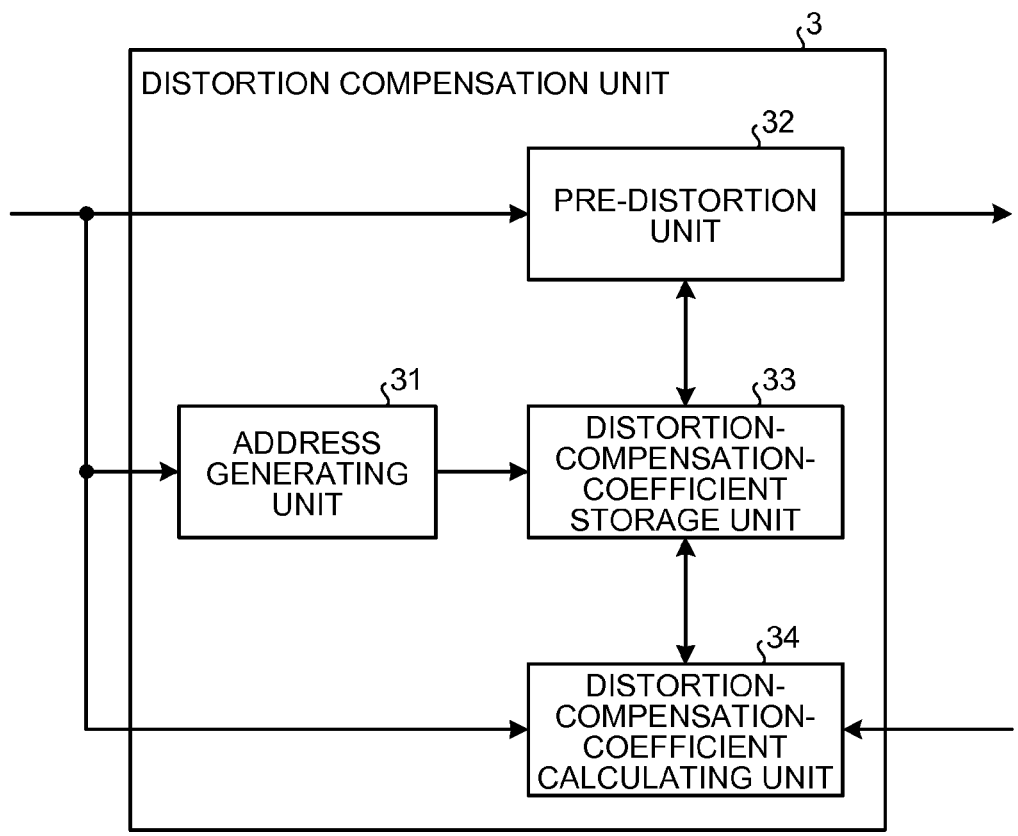
FIG. 2 is a block diagram indicating details of a distortion compensation unit.

Next, details of the distortion compensation unit 3 are explained with reference to FIG. 2 and FIG. 3. FIG. 2 is a block diagram indicating details of the distortion compensation unit. Moreover, FIG. 3 is a block diagram indicating details of an address generating unit.

As indicated in FIG. 2, the distortion compensation unit 3 includes an address generating unit 31, a pre-distortion unit 32, a distortion-compensation-coefficient storage unit 33, and a distortion-compensation-coefficient calculating unit 34.

As indicated in FIG. 3, the address generating unit 31 includes a power calculating unit 301, a power log convertor 302, a power-log normalizing unit 303, an exponentiation calculating unit 304, and an address calculating unit 305.

The power calculating unit 301 calculates transmission power of a transmission signal that is input from the S/P converter 2. For example, when a transmission signal at time t is x(t), the power calculating unit 301 calculates as transmission power $p=|x(t)|^2$. The power calculating unit 301 then outputs a calculated value of the transmission power to the power log convertor 302.

The power log convertor 302 receives input of the value of the transmission power from the power calculating unit 301. The power log convertor 302 then takes a logarithm of the received value of transmission power. The value obtained by taking the logarithm of the transmission power is referred to as "power log value" in the following. The power log convertor 302 outputs the acquired power log value to the power-log normalizing unit 303.

The power-log normalizing unit 303 receives input of the power log value from the power log convertor 302. The power-log normalizing unit 303 then normalizes the received power log value. In the following, the value obtained by normalizing a power log value is referred to as "power-log normalized value". The power-log normalizing unit 303 outputs the acquired power-log normalized value to the exponentiation calculating unit 304.

The exponentiation calculating unit 304 receives input of the power-log normalized value from the power-log normalizing unit 303. The exponentiation calculating unit 304 then calculates an exponentiated value of the received power-log normalized value with a predetermined power exponent. For example, in the present embodiment, the exponentiation calculating unit 304 calculates the second power of the power-log normalized value. The exponentiation calculating unit 304 outputs the value obtained by exponentiating the power-log normalized value to the address calculating unit 305.

The address calculating unit 305 receives the value obtained by taking a logarithm of the value of the transmission power of the transmission signal, normalizing the logarithm and then exponentiating the normalized value, from the exponentiation calculating unit 304. Moreover, the address calculating unit 305 generates an address of one-dimensional direction corresponding to the received value, for example. The address calculating unit 305 then outputs the generated address to the distortion-compensation-coefficient storage unit 33 as address specification information.

The distortion-compensation-coefficient storage unit 33 has a lookup table (LUT) in which a distortion compensation coefficient is stored in each one-dimensional address. In the LUT in the distortion-compensation-coefficient storage unit 33 of the present embodiment, an address is allocated according to a value obtained by taking a logarithm of a value of a transmission power of the transmission signal, normalizing the logarithm and then calculating the second power of the normalized value. The addresses of the LUT are allocated uniformly to values of an object of allocation of an address. Therefore, when allocation of address is changed, processing of changing original information to calculate a value of an object of allocation, or of converting the original information by using a function or the like is to be performed. The original information to calculate a value of an object of allocation is, for example, power, amplitude, and the like of a transmission signal. Furthermore, conversion of the original information is processing of taking a logarithm of power of a transmission signal or the like. In the present embodiment, as a value of an object of allocation of an address, a value obtained by taking a logarithm of transmission power is normalized, and further, the second power thereof is calculated, thereby appropriately performing allocation of an address to each power region.

FIG. 4 is a table indicating allocation of addresses in the LUT according to the first embodiment. Moreover, FIG. 5 is a chart indicating correspondence between a value that is obtained by exponentiating a value obtained by normalizing a value obtained by taking a logarithm of power, and an allocated address. A line at an upper portion of a graph 202 in FIG. 5 indicates a value that is obtained by taking a logarithm of transmission power, and by performing normalization thereof, and further performing exponentiation thereof, and a line at a lower portion indicates an address. In this example, 10 decibels (dB) is the maximum power, 0 dB is the average power, and −40 dB is the minimum compensation power. Moreover, there are 100 addresses in the LUT. As indicated in a table 201 in FIG. 4, in the LUT according to the present embodiment, 36 addresses are allocated to power of 10 dB to 0 dB. This corresponds to a range 221 in FIG. 5. Furthermore, 28 addresses are allocated to power of 0 dB to −10 dB. This corresponds to a range 222 in FIG. 5. Moreover, 18 addresses are allocated to power of −10 dB to −20 dB. This corresponds to a range 223 in FIG. 5. Furthermore, 8 addresses are allocated to power of −20 dB to −30 dB. This corresponds to a range of 224 in FIG. 5. Moreover, 2 addresses are allocated to power of −30 dB to −40 dB. This corresponds to a range of 225 in FIG. 5. In the LUT of the present embodiment, as indicated in FIG. 5, more address are allocated to a region with higher power, and the number of addresses decreases as power lowers.

Figure 6:
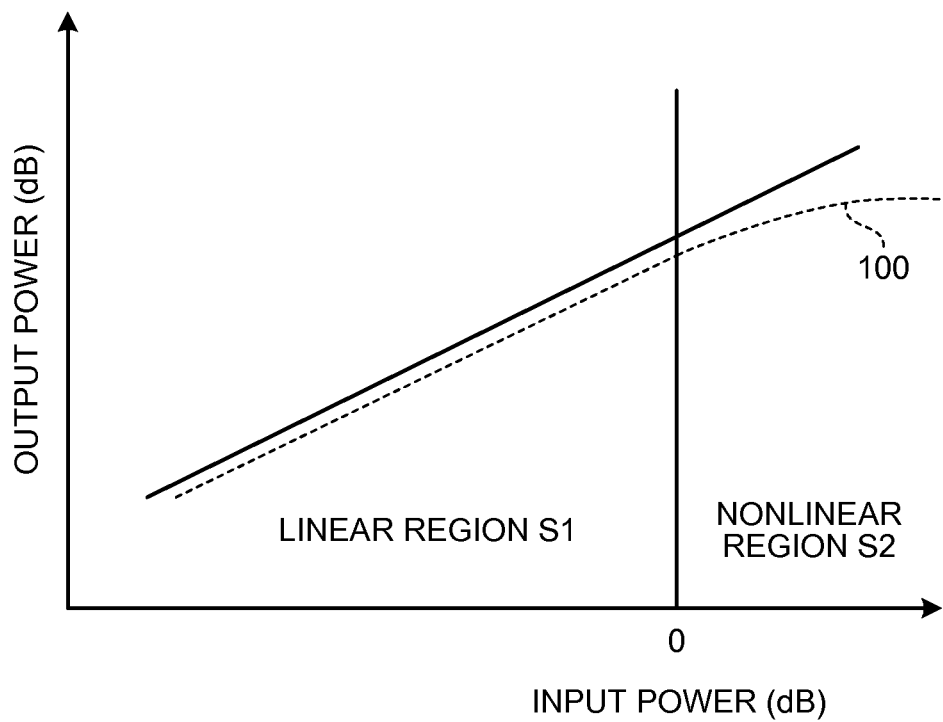
FIG. 6 is a diagram indicating input/output characteristics of an amplifier.

FIG. 6 indicates input/output characteristics of an amplifier. A vertical axis in FIG. 6 indicates output power, and a horizontal axis indicates input power. The input/output characteristics of the amplifier 11 is not a straight line as indicated by a dotted line 100, that is, nonlinear. Particularly between the maximum power of the input power and a value slightly lower than 0 dB, the nonlinear distortion is significant. Therefore, it is desirable that distortion compensation be performed at frequent intervals in this part in which the nonlinear distortion is significant, specifically, in a nonlinear region S2 in FIG. 6. On the other hand, in a linear region S1 in FIG. 6, distortion compensation is not required to be performed as frequently as in the nonlinear region S2. In this point, In the LUT according to the present embodiment, a lot of addresses are allocated in a high power region from the maximum power 10 dB to the average power 0 dB and an intermediate power region from 0 dB to −10 dB, and therefore, distortion compensation can be performed at frequent intervals in the high power region and the intermediate power region. Moreover, to power regions of −10 dB to −20 dB, and −20 dB to −30 dB in which linearity is kept to some extent also, an appropriate number of addresses are allocated. Furthermore, to a low power region from −30 dB to −40 dB also, distortion compensation can be performed. As described, in the LUT according to the present embodiment, LUT addresses are precisely allocated according to the transmission power, and the distortion compensation performance is improved.

The distortion-compensation-coefficient storage unit 33 receives input of address specification information from the address generating unit 31. The distortion-compensation-coefficient storage unit 33 then receives instruction from the pre-distortion unit 32 to read a distortion compensation coefficient that is stored in an address specified in the address specification information. Thereafter, the distortion-compensation-coefficient storage unit 33 outputs the read distortion compensation coefficient to the pre-distortion unit 32.

The pre-distortion unit 32 receives input of a transmission signal from the S/P converter 2. The pre-distortion unit 32 then requests acquisition of a distortion compensation coefficient to the received transmission signal to the distortion-compensation-coefficient storage unit 33. Thereafter, the pre-distortion unit 32 receives input of the distortion compensation coefficient to the received transmission signal from the distortion-compensation-coefficient storage unit 33. The pre-distortion unit 32 performs distortion compensation processing on the transmission signal by multiplying the received transmission signal by the distortion compensation coefficient acquired from the distortion-compensation-coefficient storage unit 33, or the like. The pre-distortion unit 32 then outputs the transmission signal subjected to the distortion compensation processing to the D/A converter 4.

The distortion-compensation-coefficient calculating unit 34 receives input of a transmission signal from the S/P converter 2. Furthermore, the distortion-compensation-coefficient calculating unit 34 receives a feedback demodulation signal from the A/D converter 5. The distortion-compensation-coefficient calculating unit 34 compares the transmission signal before distortion compensation and the feedback demodulation signal by adaptive signal processing using a least mean square algorithm, and calculates a distortion compensation coefficient such that the difference thereof is to be 0. The distortion-compensation-coefficient calculating unit 34 then updates coefficients stored in the LUT held in the distortion-compensation-coefficient storage unit 33 with the calculated distortion compensation coefficient.

Figure 7:
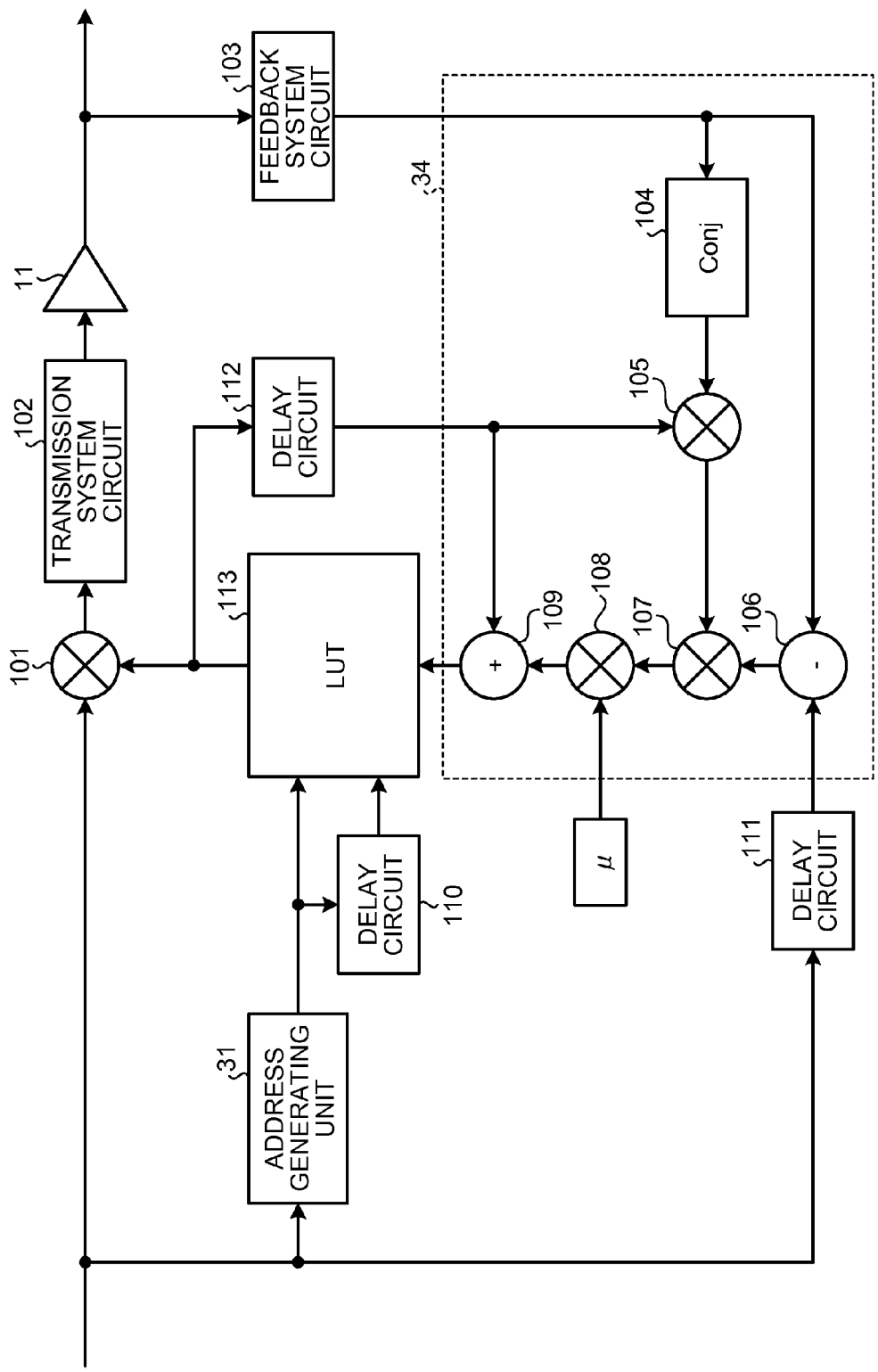
FIG. 7 is a configuration diagram indicating details of hardware of the distortion compensation apparatus according to the first embodiment.

Next, operation of the distortion compensation apparatus according to the present embodiment is more specifically explained with reference to FIG. 7. FIG. 7 is a configuration diagram indicating details of hardware of the distortion compensation apparatus according to the first embodiment.

An LUT 113 implements functions of a lookup table included in the distortion-compensation-coefficient storage unit 33 indicated in FIG. 2. Moreover, a multiplier 101 implements functions of the pre-distortion unit 32. Furthermore, a complex-conjugate-signal output unit 104, a multiplier 105, a subtracter 106, a multiplier 107, a multiplier 108, and an adder 109 implement functions of the distortion-compensation-coefficient calculating unit 34 indicated in FIG. 2. In FIG. 7, the complex-conjugate-signal output unit 104 is expressed as "Conj" for convenience sake.

A signal transmitted from the S/P converter 2 is input to the multiplier 101, the address generating unit 31, and a delay circuit 111.

The address generating unit 31 generates an address from a value obtained by taking a logarithm of a power value of the received transmission signal and by exponentiating the value. The address generating unit 31 then outputs the generated address to the LUT 113 as address specification information. Furthermore, the address generating unit 31 outputs the generated address to the delay circuit 110.

The multiplier 101 acquires a distortion compensation coefficient from the address of the LUT 113 specified by the address generating unit 31. Moreover, the distortion compensation coefficient stored in the address of the LUT 113 specified by the address generating unit 31 is transmitted to a delay circuit 112. The multiplier 101 multiplies the transmission signal by the acquired distortion compensation coefficient and outputs a result of multiplication to a transmission system circuit 102. In the present embodiment, addresses of the LUT 113 are allocated as indicated in FIG. 4 to power of a transmission signal. Therefore, distortion compensation processing by the multiplier 101 is performed appropriately to any power region.

The transmission system circuit 102 includes the D/A converter 4, the quadrature modulator 6, the frequency converter 8, and the like indicated in FIG. 1. The transmission system circuit 102 performs various kinds of processing such as D/A conversion, quadrature modulation, and frequency conversion, on the transmission signal subjected to the distortion compensation processing by the multiplier 101, to output to the amplifier 11.

The amplifier 11 amplifies the transmission signal subjected to the distortion compensation processing. The amplifier 11 then transmits the amplified transmission signal through the antenna, and outputs to a feedback system circuit 103.

The feedback system circuit 103 includes the A/D converter 5, the quadrature detector 7, the frequency converter 8, and the like indicated in FIG. 1. The feedback system circuit 103 outputs a feedback demodulation signal that is obtained by performing various kinds of processing such as the frequency conversion, quadrature detection, and A/D conversion on the amplified transmission signal received from the amplifier 11, to the complex-conjugate-signal output unit 104 and the subtracter 106.

The delay circuits 110 to 112 add delay time from input of a transmission signal to the amplifier 11 to input of a feedback demodulation signal to the subtracter 106, to each input signal. For example, when delay time in the amplifier 11 is D0, and delay time in the feedback system circuit 103 is D1, the delay circuits 110 to 112 add delay that satisfies D0+D1 to each signal.

The complex-conjugate-signal output unit 104 calculates a complex conjugate signal of the received feedback demodulation signal. The complex-conjugate-signal output unit 104 then outputs the complex conjugate signal to the multiplier 105.

The subtracter 106 subtracts the feedback demodulation signal received from the feedback system circuit 103 from the transmission signal received from the delay circuit 111, to acquire difference between the transmission signal received from the delay circuit 111 and the feedback demodulation signal. The subtracter 106 then outputs the acquired difference to the multiplier 107.

The multiplier 105 multiplies the complex conjugate signal input from the complex-conjugate-signal output unit 104 by the distortion compensation coefficient input from the delay circuit 112. The multiplier 105 then outputs a result of multiplication to the multiplier 107.

The multiplier 107 multiplies the difference between the feedback demodulation signal and the transmission signal input from the subtracter 106 by the result of multiplication of the complex conjugate signal and the distortion compensation coefficient input from the multiplier 105. The multiplier 107 then outputs a result of multiplication to the multiplier 108.

The multiplier 108 multiplies the value input from the multiplier 107 by a step-size parameter μ. The multiplier 108 then outputs a result of multiplication to the adder 109.

The adder 109 ads the value input from the multiplier 108 and the distortion compensation coefficient input from the delay circuit 112. The adder 109 then transmits a result of addition to the LUT 113.

The LUT 113 updates a value stored in the address input from the delay circuit 110 to the value input from the adder 109. Thus, a value stored in an address of the LUT 113 corresponding to a transmission signal is updated, to converge finally to a value of an optimal distortion compensation coefficient, and thereby compensating distortion of the amplifier 11.

Figure 8:
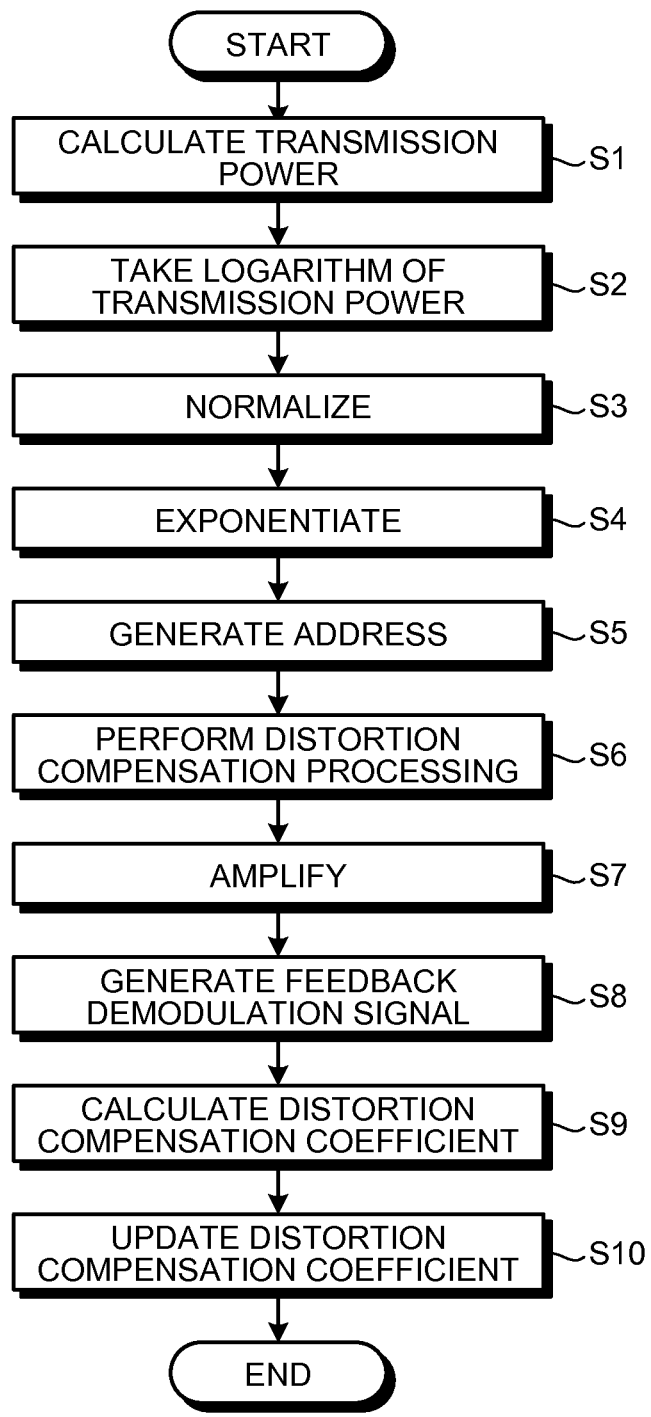
FIG. 8 is a flowchart of distortion compensation processing performed by the distortion compensation apparatus according to the first embodiment.

Next, a flow of the distortion compensation processing performed by the distortion compensation apparatus according to the present embodiment is explained with reference to FIG. 8. FIG. 8 is a flowchart of the distortion compensation processing performed by the distortion compensation apparatus according to the first embodiment.

The power calculating unit 301 of the distortion compensation unit 3 calculates transmission power of an input transmission signal (step S1)

The power log convertor 302 receives a value of the transmission power from the power calculating unit 301. The power log convertor 302 then converts the transmission power into a logarithm by taking the logarithm of the value of the transmission power to acquire a power log value (step S2).

The power-log normalizing unit 303 receives input of the power log value from the power log convertor 302. The power-log normalizing unit 303 then acquires a power-log normalized value by normalizing the power log value (step S3).

The exponentiation calculating unit 304 receives input of the power-log normalized value from the power-log normalizing unit 303. The exponentiation calculating unit 304 then exponentiates the power-log normalized value (step S4).

The address calculating unit 305 receives input of the value obtained by exponentiation of the power-log normalized value from the exponentiation calculating unit 304. The address calculating unit 305 then generates an address from a value obtained by exponentiating a value obtained by normalizing a value obtained by taking a logarithm of the transmission power of a transmission signal (step S5). The address calculating unit 305 outputs the generated address to the distortion-compensation-coefficient storage unit 33 as address specification information.

The pre-distortion unit 32 acquires the distortion compensation coefficient stored in the address specified by the address calculating unit 305 in the LUT in the distortion-compensation-coefficient storage unit 33. The pre-distortion unit 32 then performs distortion compensation processing on the transmission signal using the acquired distortion compensation coefficient (step S6). The pre-distortion unit 32 outputs the transmission signal subjected to the distortion compensation processing to the amplifier 11.

The amplifier 11 amplifies the transmission signal subjected to the distortion compensation processing by the pre-distortion unit 32 (step S7). The amplifier 11 then transmits the amplified transmission signal through the antenna and outputs to the frequency converter 10.

The frequency converter 10, the quadrature detector 7, and the A/D converter 5 generates a feedback demodulation signal from the amplified transmission signal received from the amplifier 11 (step S8).

The distortion-compensation-coefficient calculating unit 34 calculates a distortion compensation coefficient using the transmission signal before distortion compensation and the feedback demodulation signal (step S9).

The distortion-compensation-coefficient calculating unit 34 then updates a distortion compensation coefficient in the distortion-compensation-coefficient storage unit 33 with the calculated distortion compensation coefficient (step S10).

As described above, the distortion compensation apparatus according to the present embodiment performs allocation of an address to a value that is obtained by performing normalization of a value obtained by taking a logarithm of power of a transmission signal, and by further performing exponentiation thereof. Thus, precision in selecting a distortion compensation coefficient in the high power region and the intermediate power region can be improved, and furthermore, distortion compensation in the low power region is enabled. Therefore, the effect of distortion compensation can be improved.

Moreover, the distortion compensation apparatus according to the present embodiment only changes a value to be an object of allocation of an address, and therefore, the functions of the present embodiment can be implemented only by adding a circuit in a remarkably small scale compared to that in conventional distortion compensation apparatuses.

Figures 9, 10:
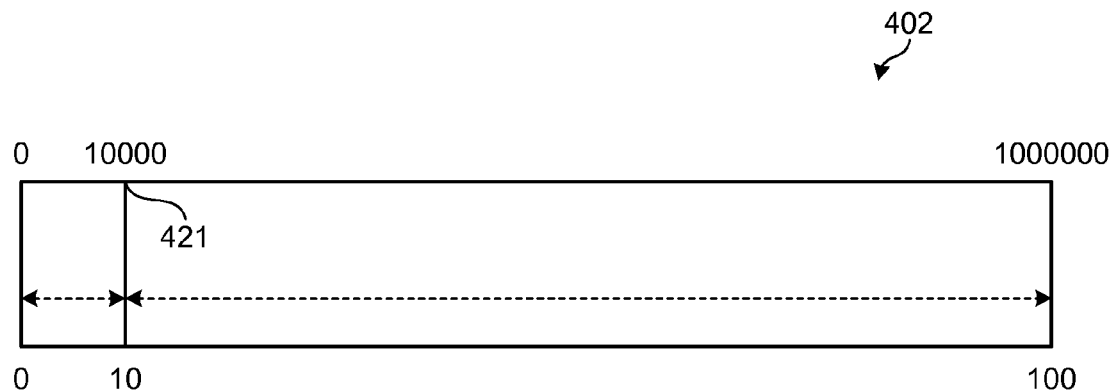
FIG. 9 is a table indicating allocation of an address according to transmission power.
FIG. 10 is a chart indicating correspondence between transmission power and an address.
Figure 11:
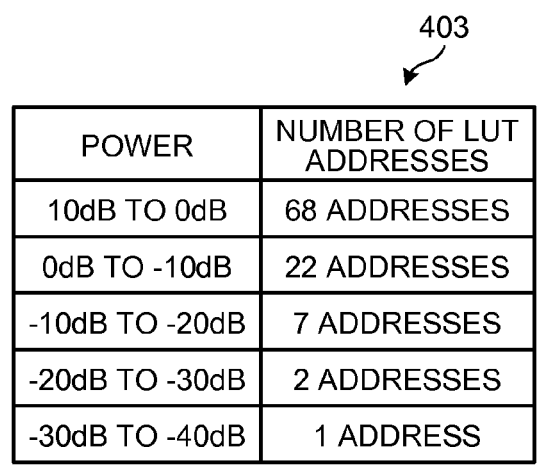
FIG. 11 is a table indicating allocation of an address according to amplitude.
Figure 12:
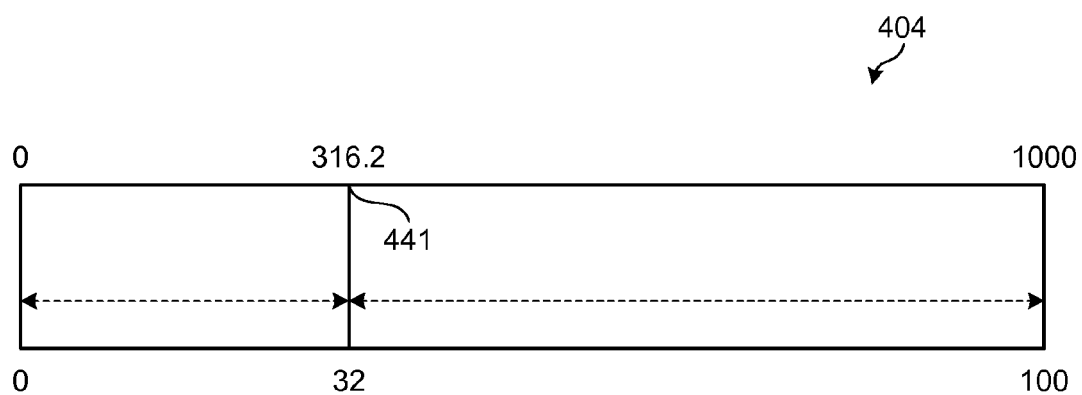
FIG. 12 is a chart indicating correspondence between amplitude and an address.
Figures 13, 14:
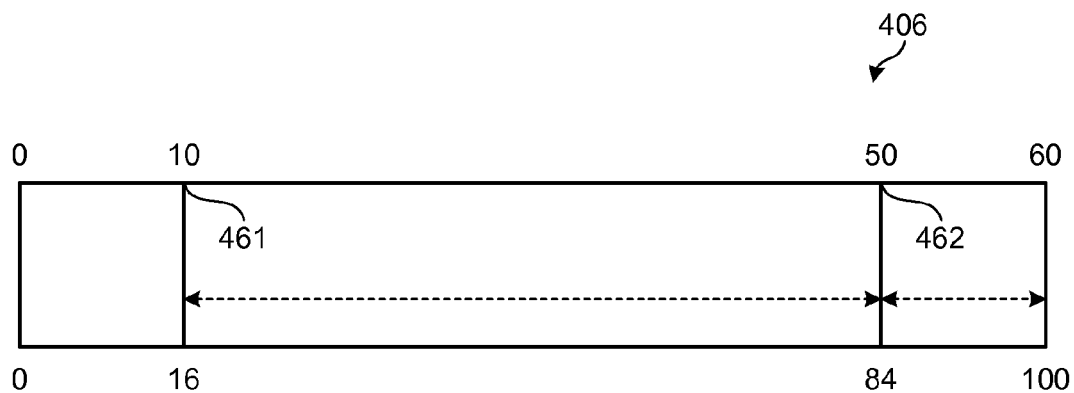
FIG. 13 is a table indicating allocation of an address according to a value obtained by taking a logarithm of transmission power.
FIG. 14 is a chart indicating correspondence between a value obtained by taking a logarithm of transmission power and an address.
Figures 15, 16:
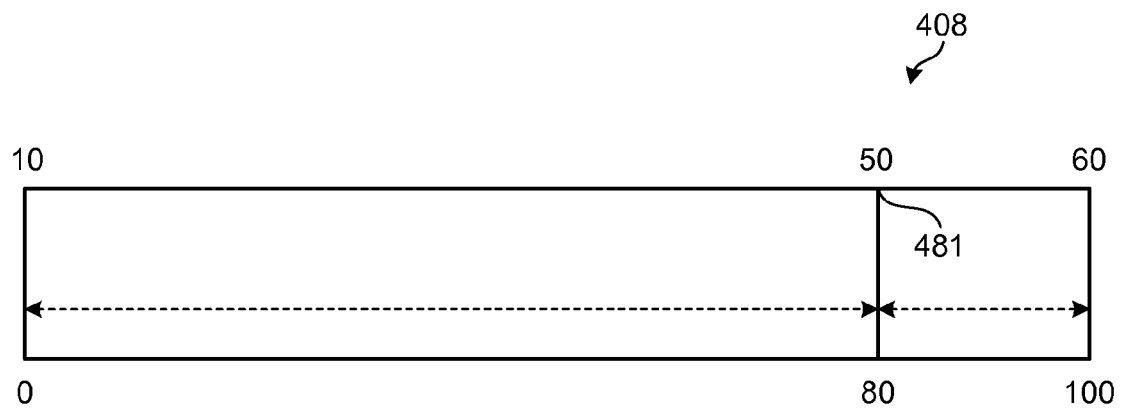
FIG. 15 is a table indicating allocation of an address according to a value obtained by normalizing the value obtained by taking a logarithm of transmission power.
FIG. 16 is a chart indicating correspondence between a value obtained by normalizing the value obtained by taking a logarithm of transmission power and an address.
Figure 17:
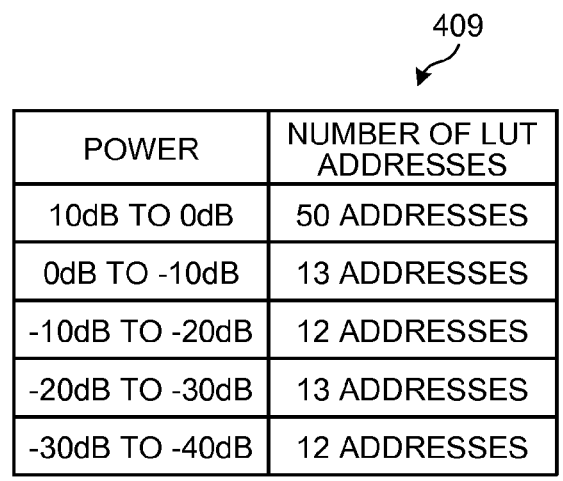
FIG. 17 is a table indicating allocation of an address according the value obtained by normalizing the value obtained by taking a logarithm of transmission power with power equal to or lower than average power, and according to amplitude with power equal to or higher than the average power.
Figure 18:
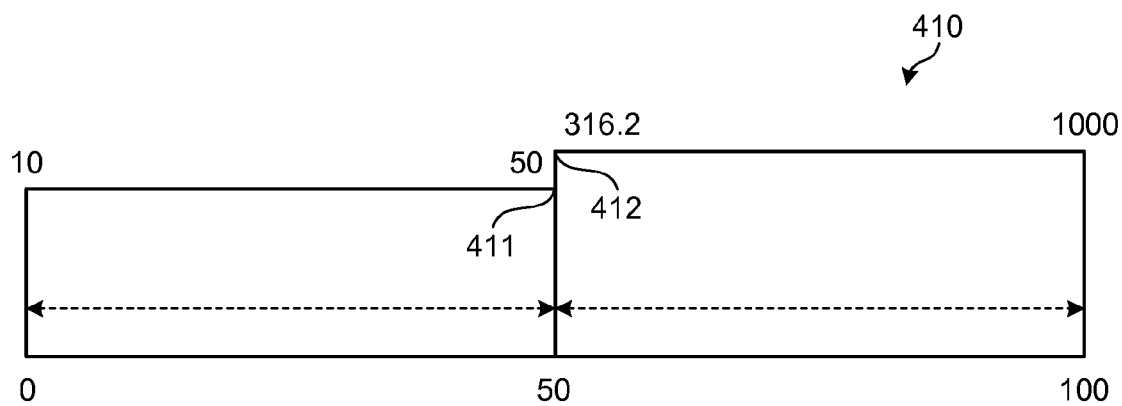
FIG. 18 a chart indicating correspondence among a value obtained by normalizing the value obtained by taking a logarithm of transmission power, amplitude, and an address.

Comparison between allocation of addresses when another address allocation method is used and the present embodiment is explained. FIG. 9 is a table indicating allocation of an address according to transmission power. FIG. 10 is a chart indicating correspondence between transmission power and an address. FIG. 11 is a table indicating allocation of an address according to amplitude. FIG. 12 is a chart indicating correspondence between amplitude and an address. FIG. 13 is a table indicating allocation of an address according to a value obtained by taking a logarithm of transmission power. FIG. 14 is a chart indicating correspondence between a value obtained by taking a logarithm of transmission power and an address. FIG. 15 is a table indicating allocation of an address according to a value obtained by normalizing the value obtained by taking a logarithm of transmission power. FIG. 16 is a chart indicating correspondence between a value obtained by normalizing the value obtained by taking a logarithm of transmission power and an address. FIG. 17 is a table indicating allocation of an address according the value obtained by normalizing the value obtained by taking a logarithm of transmission power for power equal to or lower than average power, and according to amplitude for power equal to or higher than the average power. FIG. 18 a chart indicating correspondence among a value obtained by normalizing the value obtained by taking a logarithm of transmission power, amplitude, and an address.

As indicated in a table 401 in FIG. 9, allocation of an address is done using transmission power as a value to be an object of allocation of an address. In this case, while address precision is high between the maximum power 10 dB and the average power 0 dB, address precision is very low in a low power region. An upper portion of a graph 402 in FIG. 10 indicates transmission power, and a lower portion thereof indicates an address. Power 421 is the average power. As indicated in FIG. 10, because the average power is in a lower value than a median value of the entire transmission power, it is understood that most addresses are allocated between the average power and the maximum power. In this case, compared to the present embodiment, it is difficult to perform distortion compensation appropriately in the low power region.

In a table 403 in FIG. 11, allocation of an address is done using amplitude as a value to be an object of allocation of an address according to transmission power. In this case, while address precision is high between the maximum power 10 dB and the average power 0 dB, address precision is very low in a low power region. An upper portion of a graph 404 in FIG. 12 indicates amplitude, and a lower portion thereof indicates an address. Amplitude 441 is the average amplitude. As indicated in FIG. 12, because the average amplitude is in a lower value than a median value of the entire amplitude, it is understood that most addresses are allocated between the average amplitude and the maximum amplitude. In this case also, compared to the present embodiment, it is difficult to perform distortion compensation appropriately in the low power region.

In a table 405 in FIG. 13, allocation of an address is done using a value obtained by taking a logarithm of transmission power as a value to be an object of allocation of an address. In this case, compared to cases indicated in FIG. 9 and FIG. 11, while address precision is high between the average power 0 dB and the minimum compensation power −40 dB, address precision is low in a high power region in which higher precision is required. An upper portion of a graph 406 in FIG. 14 indicates a value obtained by taking a logarithm of transmission power, and a lower portion thereof indicates an address. A value 461 is the minimum compensation value of a value obtained by taking a logarithm of transmission power, and a value 462 is the average value of values obtained by taking a logarithm of transmission power. As indicated in FIG. 14, because the average value is in a significantly higher value than a median value of the entire values obtained by taking a logarithm of transmission power, it is understood that most addresses are allocated between the average value and the minimum compensation value. Moreover, because an address corresponding to a value lower than the minimum compensation value is present, all of the addresses cannot be used. In this case, compared to the present embodiment, it is difficult to perform distortion compensation appropriately in the high power region and the intermediate power region.

In a table 407 in FIG. 15, allocation of an address is done using a value obtained by normalizing a value that is obtained by taking a logarithm of transmission power as a value to be an object of allocation of an address. In this case, unlike the case in FIG. 13, all of the addresses can be used. However, in this case also, while address precision is high between the average power 0 dB and the minimum compensation power −40 dB, address precision is low in a high power region in which higher precision is required. An upper portion of a graph 408 in FIG. 16 indicates a value obtained by normalizing a value that is obtained by taking a logarithm of transmission power, and a lower portion thereof indicates an address. A value 481 is the average value of values obtained by normalizing a value that is obtained by taking a logarithm of transmission power. As indicated in FIG. 16, because the average value is in a significantly higher value than a median value of the entire values obtained by taking a logarithm of transmission power, it is understood that most addresses are allocated between the average value and the minimum compensation value. In this case also, compared to the present embodiment, it is difficult to perform distortion compensation appropriately in the high power region and the intermediate power region.

In a table 409 in FIG. 17, allocation of an address is done using a value obtained by normalizing a value that is obtained by taking a logarithm of transmission power for transmission power equal to or lower than the average power as a value to be an object of allocation of an address. Moreover, for a value exceeding the average power, allocation of an address is done according to transmission power using amplitude. In this case, address precision is high between the maximum power 10 dB and the average power 0 dB. However, address precision is same in the intermediate power region of 0 dB to −10 dB and in the low power region of −20 dB to −30 dB, and allocation of addresses in the intermediate power region in which higher precision is required is few. An upper left portion of a graph 410 in FIG. 18 indicates a value obtained by normalizing a value that is obtained by taking a logarithm of transmission power, and an upper right portion indicates amplitude. Furthermore, a lower portion of the graph 410 indicates an address. A value 411 is the average value of values obtained by normalizing a value that is obtained by taking a logarithm of transmission power. Moreover, a value 412 is the average amplitude. As indicated in FIG. 18, because a lot of addresses are allocated between the average amplitude and the maximum amplitude, address precision between the average amplitude and the maximum amplitude is high. However, in this case, compared to the present embodiment, it is difficult to perform distortion compensation appropriately in the intermediate power region of 0 dB to −10 dB.

(Modification)

A modification of the distortion compensation apparatus according to the first embodiment is explained. A distortion compensation apparatus according to this modification differs from the first embodiment in that a value that is obtained by calculating 2.5-th power of a value obtained by normalizing a value obtained by taking a logarithm of a value of power of a transmission signal is used as a value to be an object of allocation of an address.

FIG. 19 is a table indicating allocation of an address in an LUT according to the modification of the first embodiment. A table 203 in FIG. 19 indicates allocation of an address when a value that is obtained by calculating 2.5-th power of a value obtained by normalizing a value obtained by taking a logarithm of a value of power of a transmission signal is used as a value to be an object of allocation of an address.

As indicated in the table 203, in the LUT according to the present modification, 43 addresses are allocated to power of 10 dB to 0 dB. Furthermore, 29 addresses are allocated to power of 0 dB to −10 dB. Moreover, 18 addresses are allocated to power of −10 dB to −20 dB. Furthermore, 8 addresses are allocated to power of −20 dB to −30 dB. Moreover, 2 addresses are allocated to power of −30 dB to −40 dB.

As above, also when a value that is obtained by calculating 2.5-th power of a value obtained by normalizing a value obtained by taking a logarithm of a value of power of a transmission signal is an object of allocation of an address, a lot of addresses are allocated in the high power region of the maximum power 10 dB to the average power 0 dB, and in the intermediate power region of 0 dB to −10 dB. Therefore, distortion compensation can be performed at frequent intervals in the high power region and the intermediate power region. Moreover, to power regions of −10 dB to −20 dB, and −20 dB to −30 dB in which linearity is kept to some extent also, an appropriate number of addresses are allocated. Furthermore, to the low power region from −30 dB to −40 dB also, distortion compensation can be performed. As described, in the LUT according to the present embodiment, LUT addresses are precisely allocated according to the transmission power, and the distortion compensation performance is improved.

As described, also when the power exponent is 2.5, precision in selecting a distortion compensation coefficient in the high power region and the intermediate power region can be improved, and furthermore, distortion compensation in the low power region is enabled. Therefore, the effect of distortion compensation can be improved.

Moreover, although in the first embodiment and the modification, the cases in which the power exponent is 2 and is 2.5 are explained, it is not limited thereto, and an exponent can be taken as appropriate according to how an address in the LUT is allocated.

[b] Second Embodiment

Figure 20:
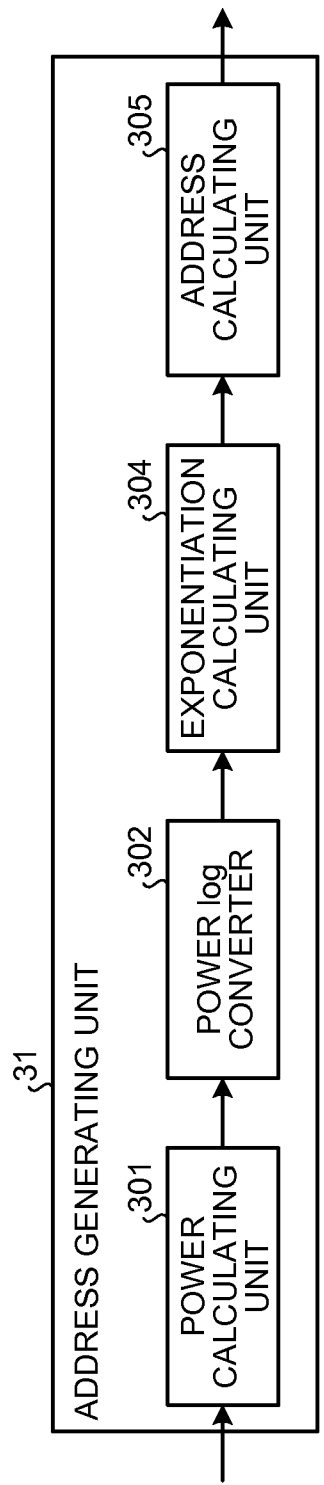
FIG. 20 is a block diagram indicating details of an address generating unit of a distortion compensation apparatus according to a second embodiment.

FIG. 20 is a block diagram indicating details of an address generating unit of a distortion compensation apparatus according to a second embodiment. The distortion compensation apparatus according to the present embodiment differs from the first embodiment in that a value that is obtained by taking a logarithm of a value of power of a transmission signal and by further performing exponentiation thereof is used as a value to be an object of allocation of an address. In the following explanation, explanation of operation of each component same as that of the first embodiment is omitted.

In an LUT in the distortion-compensation-coefficient storage unit 33 according to the present embodiment, an address is allocated according to a value obtained by calculating the second power of a value obtained by taking a logarithm of a value of transmission power.

The address generating unit 31 according to the present embodiment includes the power calculating unit 301, the power log convertor 302, the exponentiation calculating unit 304, and the address calculating unit 305.

The power calculating unit 301 calculates transmission power of a transmission signal that is input from the S/P converter 2. The power calculating unit 301 then outputs a calculated value of the transmission power to the power log convertor 302.

The power log convertor 302 receives input of the value of the transmission power from the power calculating unit 301. The power log convertor 302 then takes a logarithm of the received value of transmission power. The power log convertor 302 outputs the acquired power log value to the exponentiation calculating unit 304.

The exponentiation calculating unit 304 receives input of the power log value from the power log convertor 302. The exponentiation calculating unit 304 then calculates an exponentiated value of the received power log value with a predetermined power exponent. For example, in the present embodiment, the exponentiation calculating unit 304 calculates the second power of the power log value. The exponentiation calculating unit 304 outputs the value obtained by exponentiating the power log value to the address calculating unit 305.

The address calculating unit 305 receives the value obtained by exponentiating a value obtained by taking a logarithm of the value of the transmission power of the transmission signal from the exponentiation calculating unit 304. Moreover, the address calculating unit 305 generates an address of one-dimensional direction corresponding to the received value, for example. The address calculating unit 305 then outputs the generated address to the distortion-compensation-coefficient storage unit 33 as address specification information.

The pre-distortion unit 32 acquires a distortion compensation coefficient that is stored in an address corresponding to the value obtained by exponentiating a value obtained by taking a logarithm of a value of transmission power specified by the address calculating unit 305, from the LUT of the distortion-compensation-coefficient storage unit 33. The pre-distortion unit 32 performs distortion compensation of the transmission signal by multiplying the transmission signal by the acquired distortion compensation coefficient.

Furthermore, a flow of the distortion compensation processing performed by the distortion compensation apparatus according to the present embodiment is indicated as a flow in which the processing is performed excluding step S3 in the flow indicated in FIG. 8.

As explained above, the distortion compensation apparatus according to the present embodiment uses a value that is obtained by exponentiating a value obtained by taking a logarithm of a value of power of a transmission signal as an object of allocation of an address. Thus, even when a value obtained by taking a logarithm of a value of power of a transmission power is exponentiated without normalization thereof, an address of the LUT can be precisely allocated according to power.

[c] Third Embodiment

Figure 21:
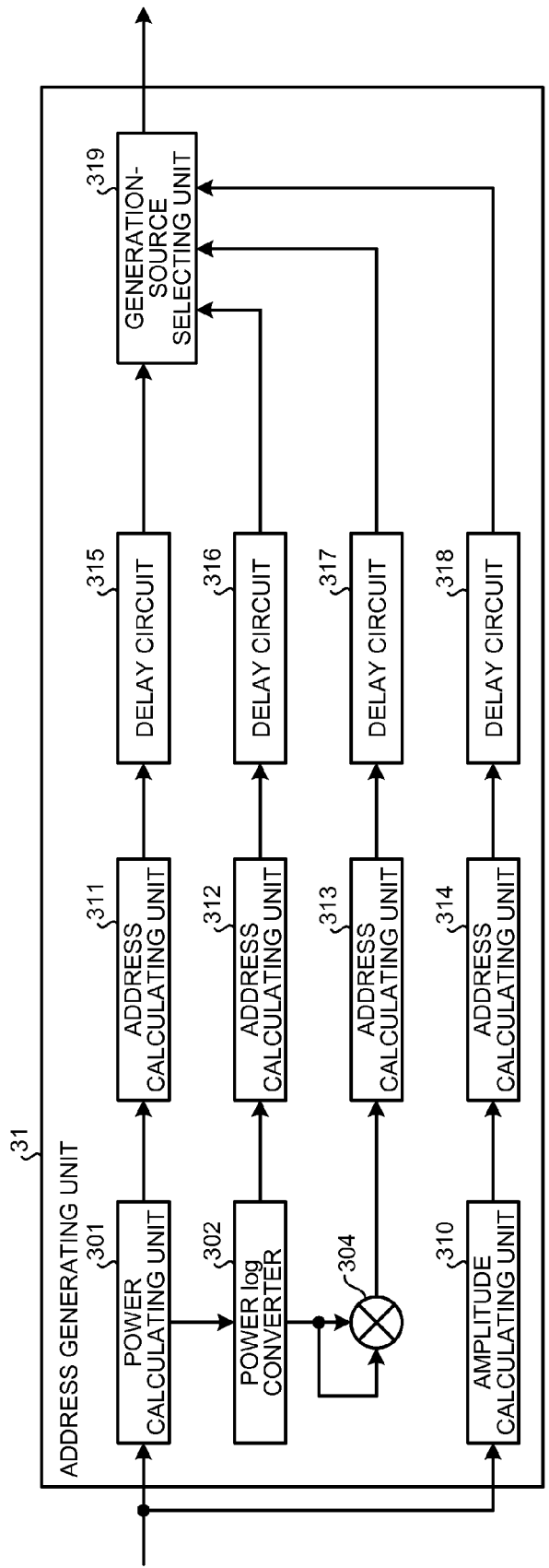
FIG. 21 is a block diagram indicating details of an address generating unit of a distortion compensation apparatus according to a third embodiment.

FIG. 21 is a block diagram indicating details of an address generating unit of a distortion compensation apparatus according to a third embodiment. The distortion compensation apparatus according to the present embodiment differs from the first and the second embodiments in that an object of allocation of an address is selectable. In the following explanation, explanation of operation of each component same as that of the first and the second embodiments is omitted.

The distortion-compensation-coefficient storage unit 33 according to the present embodiment includes an LUT in which an address is allocated according to transmission power, an LUT in which an address is allocated according to a value obtained by taking a logarithm of a value of transmission power, and an LUT in which an address is allocated according to amplitude. Furthermore, the distortion-compensation-coefficient storage unit 33 according to the present embodiment includes an LUT in which an address is allocated according to a value obtained by calculating the second power of a value obtained by taking a logarithm of a value of transmission power.

The address generating unit 31 according to the present embodiment includes the power calculating unit 301, the power log convertor 302, the exponentiation calculating unit 304, an amplitude calculating unit 310, address calculating units 311 to 314, delay circuits 315 to 318, and a generation-source selecting unit 319.

The power calculating unit 301 calculates transmission power of a transmission signal that is input from the S/P converter 2. The power calculating unit 301 then outputs a calculated value of the transmission power to the address calculating unit 311. Moreover, the power calculating unit 301 outputs the calculated value of the transmission power to the power log convertor 302.

The power log convertor 302 receives input of the value of the transmission power from the power calculating unit 301. The power log convertor 302 then takes a logarithm of the received value of transmission power to acquire a power log value. The power log convertor 302 outputs the acquired power log value to the address calculating unit 312. Furthermore, the power log convertor 302 outputs the acquired power log value to the exponentiation calculating unit 304, branching into two.

The exponentiation calculating unit 304 receives input of the power log value from the power log convertor 302. The exponentiation calculating unit 304 then calculates the second power of the power log value by multiplying the received two power log values. The exponentiation calculating unit 304 outputs the value obtained by exponentiating the power log value to the address calculating unit 313.

The amplitude calculating unit 310 calculates amplitude of a transmission signal input from the S/P converter 2. The amplitude calculating unit 310 then outputs the calculated amplitude to the address calculating unit 314.

The address calculating unit 311 receives input of a value of transmission power of a transmission signal from the power calculating unit 301. The address calculating unit 311 then generates an address corresponding to the received value. The address calculating unit 311 then outputs the generated address to the delay circuit 315.

The address calculating unit 312 receives input of a value obtained by taking a logarithm of a value of transmission power of a transmission signal from the power log converter 302. The address calculating unit 312 then generates an address corresponding to the received value. The address calculating unit 312 then outputs the generated address to the delay circuit 316.

The address calculating unit 313 receives input of a value obtained by exponentiating a value that is obtained by taking a logarithm of a value of transmission power of a transmission signal from the exponentiation calculating unit 304. The address calculating unit 313 then generates an address corresponding to the received value. The address calculating unit 313 then outputs the generated address to the delay circuit 317.

The address calculating unit 314 receives input of a value of amplitude of a transmission signal from the amplitude calculating unit 310. The address calculating unit 314 then generates an address corresponding to the received value. The address calculating unit 314 then outputs the generated address to the delay circuit 318.

The delay circuits 315 to 318 add delay to the respective input signals to adjust timing such that the signals are input to the generation-source selecting unit 319 at the same time.

The generation-source selecting unit 319 receives the address according to the transmission power, the address corresponding to the value obtained by taking a logarithm of transmission power, the address corresponding to the value obtained by exponentiating a value that is obtained by taking a logarithm of transmission power, and the address corresponding to the amplitude from the delay circuits 315 to 318. The generation-source selecting unit 319 selects an address that is specified as an object of allocation of an address from among the received addresses. The generation-source selecting unit 319 then outputs the selected address to the distortion-compensation-coefficient storage unit 33 together with information of the object of allocation of an address. The object of allocation of an address may be one, or a different object may be specified according to a region of transmission power.

The pre-distortion unit 32 extracts an LUT that corresponds to the object to be allocated the address that is specified by the generation-source selecting unit 319 from the distortion-compensation-coefficient storage unit 33. Furthermore, the pre-distortion unit 32 acquires the distortion compensation coefficient stored in the address specified by the generation-source selecting unit 319 in the extracted LUT from the LUT in the distortion-compensation-coefficient storage unit 33. The pre-distortion unit 32 then performs distortion compensation processing of the transmission signal by multiplying the transmission signal by the acquired distortion compensation coefficient.

As described above, the distortion compensation apparatus according to the present embodiment can select information to generate an address when performing the distortion compensation processing. This enables to change allocation of an address appropriately in distortion compensation according to operation. That is, it is possible to provide allocation of an address suitable for a request of an operator.

(Modification)

Figure 22:
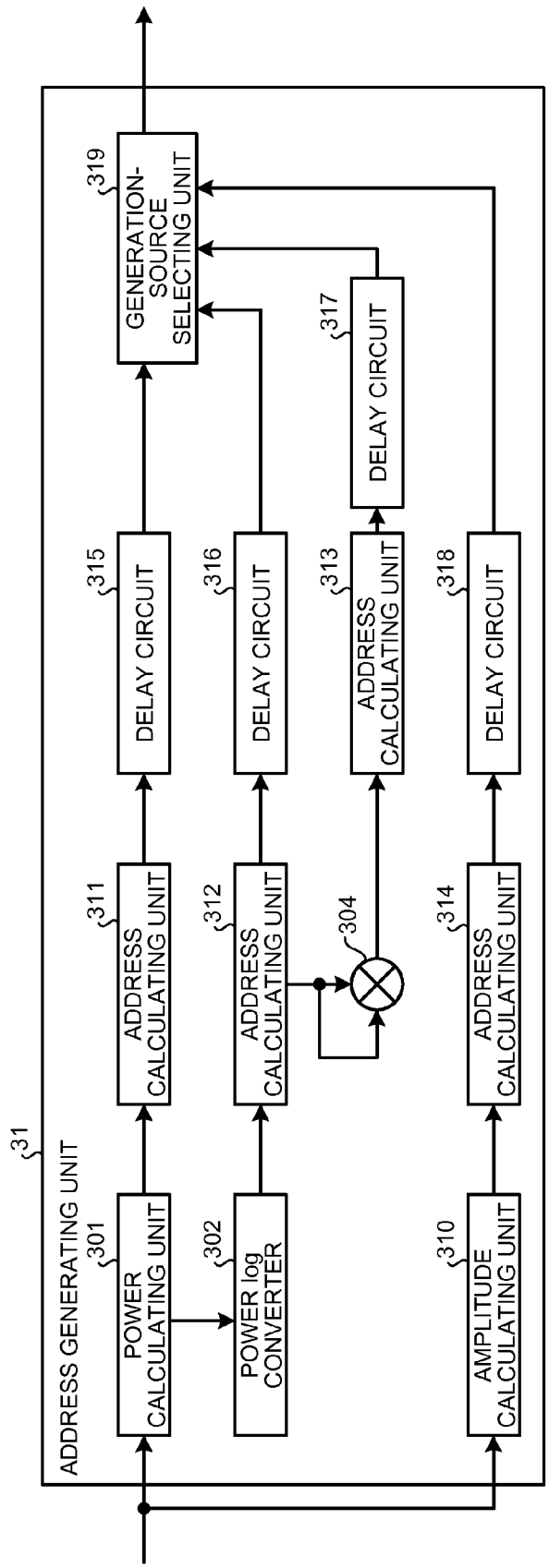
FIG. 22 is a block diagram indicating details of an address generating unit of a distortion compensation apparatus according to a modification of the third embodiment.

FIG. 22 is a block diagram indicating details of an address generating unit of a distortion compensation apparatus according to a modification of the third embodiment. The distortion compensation apparatus according to the present embodiment differs in timing of exponentiation from the third embodiment.

As indicated in FIG. 22, in the address generating unit 31 of the distortion compensation apparatus according to this modification, an address corresponding to a value obtained by taking a logarithm of transmission power is received from the address calculating unit 312. The exponentiation calculating unit 304 calculates the second power of the received address. Thereafter, the exponentiation calculating unit 304 outputs a value that is obtained by calculating the second power of the address corresponding to the value obtained by taking a logarithm of transmission power to the address calculating unit 313.

The address calculating unit 313 receives input of the value that is obtained by calculating the second power of the address corresponding to the value obtained by taking a logarithm of transmission power from the exponentiation calculating unit 304. The address calculating unit 313 then generates an address corresponding to the received value. The address calculating unit 313 then outputs the generated address to the delay circuit 317.

As explained above, even if an address is acquired by calculating an address corresponding to a value that is obtained by taking a logarithm of transmission power and then calculating the second power of the address, the similar effect as the third embodiment can be achieved.

Although a value of the second power of a value that is obtained by taking a logarithm is used as one of values to be an object of allocation of an address in the third embodiment and the modification thereof, a value that is obtained by normalizing a value obtained by taking a logarithm of transmission power, and then by calculating the second power thereof may be used as a value of an object of allocation of an address.

Moreover, although a value that is obtained by taking a logarithm of transmission power is squared in the third embodiment and the modification thereof, the value to be exponentiated is not limited thereto, and it is possible to exponentiate a value appropriate according to how an address of the LUT is allocated.

[d] Fourth Embodiment

Figure 23:
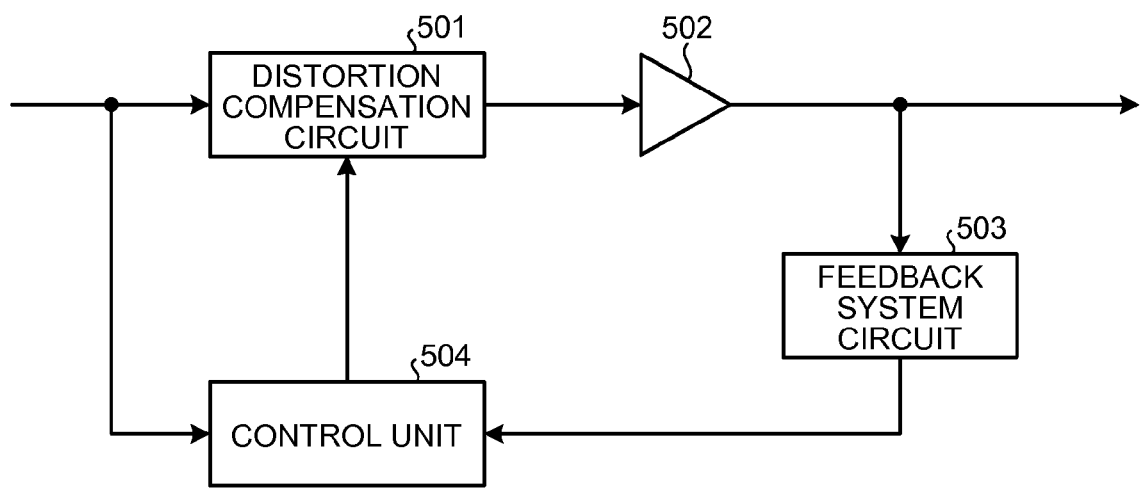
FIG. 23 is a block diagram of a distortion compensation apparatus according to a fourth embodiment.

FIG. 23 is a block diagram of a distortion compensation apparatus according to a fourth embodiment. The distortion compensation apparatus according to the present embodiment differs from the respective embodiments described above in that a distortion compensation polynomial is used to perform distortion compensation. In the following explanation, explanation of operation of each component same as that of the respective embodiments described above is omitted.

The distortion compensation apparatus according to the present embodiment includes a distortion compensation circuit 501, an amplifier 502, a feedback system circuit 503, and a control unit 504.

The distortion compensation circuit 501 receives input of a transmission signal. The distortion compensation circuit 501 then receives control by the control unit 504 to perform distortion compensation processing on the transmission signal. Thereafter, the distortion compensation circuit 501 outputs the transmission signal subjected to the distortion compensation processing to the amplifier 502.

The amplifier 502 receives input of the transmission signal subjected to the distortion compensation processing from the distortion compensation circuit 501. The amplifier 502 then amplifies power of the received signal. Thereafter, the amplifier 502 transmits the amplified signal through an antenna, and outputs to the feedback system circuit 503.

The feedback system circuit 503 outputs a feedback demodulation signal that is obtained by performing various kinds of processing such as frequency conversion, quadrature detection, and A/D conversion on the amplified transmission signal received from the amplifier 502, to the control unit 504.

The control unit 504 stores a distortion compensation polynomial. In the present embodiment, the Volterra series is used as the distortion compensation polynomial. The Volterra series is a series expressed by a following Equation (1).

$$\tilde{y}(t) = \sum_{j=0}^{N-1} a_j x(t-j) + \sum_{j=0}^{N-1} \sum_{k=0}^{N-1} b_{j,k} x(t-j) x(t-k) + \sum_{i=1}^{M-1} c_j y(t-i) \quad (1)$$

The control unit 504 receives input of a transmission signal before subjected to the distortion compensation. Moreover, the control unit 504 receives input of the feedback demodulation signal from the feedback system circuit 503. Subsequently, the control unit 504 calculates power of the transmission signal, and further performs exponentiation of a value that is obtained by taking a logarithm of the calculated power. Furthermore, the control unit 504 calculates power of the feedback demodulation signal, and further performs exponentiation of a value that is obtained by taking a logarithm of the calculated power. The control unit 504 then calculates difference between a signal that is obtained by substituting the value obtained by exponentiating the value that is obtained by taking a logarithm of the power of the transmission signal into x(t) of the Volterra series expressed by Equation (1), and a signal that is obtained by substituting the value obtained by exponentiating the value that is obtained by taking a logarithm of the power of the feedback demodulation signal into y(t). The control unit 504 then estimates a coefficient value of the distortion compensation polynomial from the calculated difference and updates the coefficient. The control unit 504 controls the distortion compensation circuit such that distortion compensation is performed using the updated coefficient.

As explained above, the distortion compensation apparatus according to the present embodiment can generate a distortion compensation coefficient with high precision in all of the power regions by using a value that is obtained by exponentiating a value obtained by taking a logarithm of power in the distortion compensation polynomial. Therefore, it is possible to improve the distortion compensation effect.

According to an aspect of a distortion compensation apparatus and a distortion compensation method disclosed in the present application, distortion compensation performance can be improved.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A distortion compensation apparatus comprising:
    a storage unit that stores a distortion compensation coefficient;
    a distortion-compensation-coefficient selecting unit that takes a logarithm of power of an input signal and exponentiates a value obtained by taking the logarithm, and that selects a distortion compensation coefficient that is stored in the storage unit according to a value obtained by the exponentiating;
    a distortion-compensation processing unit that acquires the selected distortion compensation coefficient from the storage unit, and that performs distortion compensation processing on the input signal to the distortion-compensation-coefficient selecting unit using the acquired distortion compensation coefficient;
    an amplifier that amplifies the signal subjected to the distortion compensation processing; and
    a distortion-compensation-coefficient updating unit that updates the distortion compensation coefficient stored in the storage unit based on the amplified signal and the input signal to the distortion-compensation-coefficient selecting unit.

2. The distortion compensation apparatus according to claim 1, wherein
    the distortion-compensation-coefficient selecting unit normalizes the value obtained by taking the logarithm, and exponentiates the normalized value.

3. The distortion compensation apparatus according to claim 1, wherein
    the distortion-compensation-coefficient selecting unit selects one of power, amplitude, phase of the input signal, a value obtained by taking the logarithm of the power, and a value obtained by exponentiating the value that is obtained by taking the logarithm of the power, and selects a distortion compensation coefficient according to the selected value.

4. The distortion compensation apparatus according to claim 1, wherein
    the storage unit stores the distortion compensation coefficient in each address that is allocated so as to correspond to a value that is obtained by exponentiating the value obtained by taking the logarithm of power of the input signal, and
    the distortion-compensation-coefficient selecting unit selects a distortion compensation coefficient that is stored in the storage unit corresponding to the value that is obtained by exponentiating the value obtained by taking the logarithm of power of the input signal.

5. The distortion compensation apparatus according to claim 1, wherein
    the distortion-compensation-coefficient updating unit stores a distortion-compensation coefficient polynomial, and uses a value that is calculated by taking a logarithm of power of the input signal, and by exponentiating the value obtained by taking the logarithm in the distortion-compensation coefficient polynomial to calculate the distortion compensation coefficient used for update.

6. A distortion compensation method comprising:
    taking a logarithm of power of an input signal, exponentiating a value obtained by taking the logarithm, and selecting a distortion compensation coefficient that is stored in a storage unit according to a value obtained by the exponentiating;
    acquiring the selected distortion compensation coefficient from the storage unit and performing distortion compensation processing on the input signal using the acquired distortion compensation coefficient;
    amplifying the signal subjected to the distortion compensation processing with an amplifier; and
    updating the distortion compensation coefficient stored in the storage unit based on the signal amplified by the amplifier and the input signal.

* * * * *